(12) United States Patent
Mallory

(10) Patent No.: US 6,476,621 B1
(45) Date of Patent: Nov. 5, 2002

(54) SELF-BOOTSTRAPPING TRANSDUCER INTERFACE

(75) Inventor: Roy E. Mallory, Bedford, MA (US)

(73) Assignee: ADE Corporation, Westwoods, MA (US)

(*) Notice: Subject to any disclaimer, the term of this patent is extended or adjusted under 35 U.S.C. 154(b) by 0 days.

(21) Appl. No.: 09/896,265

(22) Filed: Jun. 29, 2001

(51) Int. Cl.[7] .............................................. G01R 27/26
(52) U.S. Cl. ...................................................... 324/678
(58) Field of Search ................................. 324/678, 680, 324/688; 323/356, 357; 330/97, 109, 149; 361/43

(56) References Cited

U.S. PATENT DOCUMENTS

| | | | |
|---|---|---|---|
| 3,453,554 A | 7/1969 | Shoemaker | 330/30 |
| 3,521,179 A | 7/1970 | Blancke | 330/30 |
| 3,530,396 A | 9/1970 | Rudolph | 330/69 |
| 4,092,701 A | 5/1978 | Bumgardner | 330/297 |
| 4,190,797 A | 2/1980 | Lecklider et al. | 324/61 R |
| 4,337,441 A | 6/1982 | Kellogg | 330/261 |
| 4,387,601 A | 6/1983 | Azegami | 73/724 |
| 4,459,541 A | 7/1984 | Fielden et al. | 324/60 CD |
| 4,584,885 A | 4/1986 | Cadwell | 73/862.61 |
| 4,636,714 A | 1/1987 | Allen | 324/60 CD |
| 4,683,754 A | 8/1987 | Hirata et al. | 73/708 |
| 4,918,376 A | 4/1990 | Poduje et al. | 324/663 |
| 5,028,876 A | 7/1991 | Cadwell | 324/678 |
| 5,148,126 A | 9/1992 | Spencer | 331/135 |
| 5,216,382 A | 6/1993 | Ito | 330/267 |
| 5,326,982 A | 7/1994 | Wiklund | 250/561 |
| 5,343,157 A | 8/1994 | Deschamps | 324/678 |
| 5,343,766 A | 9/1994 | Lee | 73/862.61 |
| 5,557,267 A | 9/1996 | Poduje et al. | 340/870.04 |
| 5,708,368 A | 1/1998 | Mallory | 324/663 |

Primary Examiner—Christine K. Oda
Assistant Examiner—Etienne P Le Roux
(74) Attorney, Agent, or Firm—Weingarten, Schurgin, Gagnebin & Lebovici LLP

(57) ABSTRACT

A mechanism to provider a bootstrapped power source for a differential operational amplifier includes a three-winding transformer having a first winding disposed between a positive voltage and a plus power input to the amplifier, yielding an initial plus voltage, a second winding disposed between a negative voltage and a minus power input to the amplifier yielding an initial minus voltage, and a third winding disposed between a ground and a plus input to the amplifier providing a feedback path. The differential operational amplifier output is connected to ground. The said amplifier minus input is connect to a signal and when the signal is displaced a first amount from a first voltage, the plus and minus power inputs are displaced approximately the same amount from the initial positive and negative voltages.

7 Claims, 5 Drawing Sheets

SELF-BOOTSTRAPPING TRANSDUCER INTERFACE

CROSS REFERENCE TO RELATED APPLICATIONS

N/A

STATEMENT REGARDING FEDERALLY SPONSORED RESEARCH OR DEVELOPMENT

N/A

BACKGROUND OF THE INVENTION

Capacitive displacement-sensing gauges are known in the art. These gauges use the change in capacitance between a capacitive displacement probe (probe) and the structure over which it is positioned (target) to measure the change in distance between the probe and the target.

These gauges are characterized by the equation that describes the capacitance of a parallel-plate capacitor.

$$C = \frac{k\varepsilon_0 A}{d} \qquad (1)$$

where

C=capacitance $\varepsilon_0$=permittivity of free space k=dielectric constant

A=plate area d=distance between plates

When using a capacitive-displacement probe, the plate area, which is the area of the probe's sensing element, is held constant, and the dielectric constant, typically air, is also constant. With this configuration, distance (d) is inversely proportional to the capacitance (C).

The voltage (v) and current (i) in a capacitor are related by equation 2.

$$v = \frac{i}{sC} \qquad (2)$$

where s is the complex frequency variable

When Equation 1 is substituted into Equation 2, v is expressed by equation 3.

$$v = \frac{id}{sk\varepsilon_0 A} \qquad (3)$$

Equation 3 implies that if frequency (s) and current (i) are held constant, voltage v is proportional to the distance d between the probe and target. This relationship leads to an operational mode where capacitive displacement probes are commonly driven with a constant current, and the voltage across the probe provides an output that varies linearly as the distance varies. Because the voltage is most likely not directly usable, it is usually processed, for instance, by a unity-gain buffer before being used.

To ensure that a linear relationship between the circuit's transfer function and distance holds in practice, the probe must be guarded to prevent parasitic capacitances from appearing in parallel with the probe capacitance. Total probe capacitances are often tenths or even hundredths of a picofarad. The linear relationship between the circuit's transfer function and distance is further ensured by utilizing a high impedance input stage in the circuit receiving the input. When a unity-gain buffer is connected to the probe, the buffer amplifier's power-supply connections must be bootstrapped to ensure that the input impedance is high enough to maintain the transfer function of the gauge.

The frequency response of the unity-gain buffer should be flat and wideband to track the capacitance. Since the power-supply characteristics affect the buffer's frequency response, it is necessary to utilize a more costly and complex power-supply in this configuration.

Another way to connect to the probe and maintain the desired transfer function is to use a differential amplifier, such as an operational amplifier, with a grounded output in place of the unity-gain buffer. In prior art, in order to be able to ground the output, the amplifier is powered by a floating power supply. The floating power supply is an additional component that increases the size and complexity of the gauge system. The required transformer may need to be large, expensive and may be susceptible to stray electric and magnetic fields. To achieve the desired function, it may need to be custom made.

BRIEF SUMMARY OF THE INVENTION

A capacitive displacement-sensing gauge in which the transducer interface stage generates its own bootstrapping voltages provides a smaller more cost-effective gauge. A differential amplifier with a grounded output is used as a transducer interface stage and power and common connections to the stage are made via a 3-winding transformer in which the three windings are equal in turns and are closely coupled. The current that flows to ground through the grounded output of this stage by necessity flows through a winding of the transformer, causing the common voltage and both supply voltages to be perfectly bootstrapped.

No active circuitry, with its concomitant limitations in phase and frequency response, is required. Cost and size are reduced by elimination of active circuitry and/or the means necessary to create a floating supply. Reliability is improved by reducing the number of circuit elements that are required. Other aspects, features, and advantages of the present invention are disclosed in the detailed description that follows.

BRIEF DESCRIPTION OF THE SEVERAL VIEWS OF THE DRAWING

The invention will be understood from the following detailed description in conjunction with the drawings, of which.

DETAILED DESCRIPTION OF THE INVENTION

Capacitive displacement-sensing gauges use the change in capacitance between a capacitive displacement probe (probe) and the structure over which it is positioned (target) to measure the change in distance between the probe and the target.

When using a capacitive displacement probe, the plate area, which is the area of the probe's sensing element, is held constant, and the dielectric constant, typically air, is also constant, so that the distance (d) is inversely proportional to capacitance (C).

Figure 1:
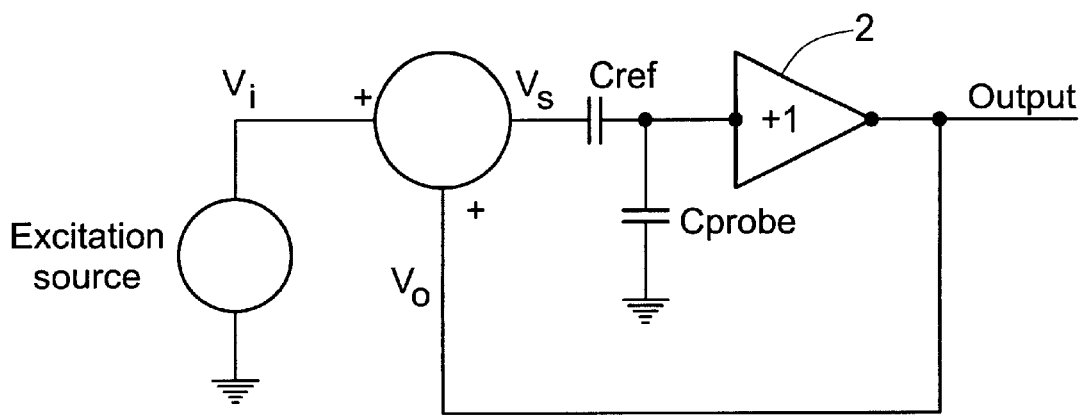
FIG. 1 is a conceptual schematic of a idealized capacitive displacement probe with the output processed by a unity-gain buffer as is known in the art.

A common technique for interfacing to the probe and providing a constant-current drive while allowing for sensing the voltage across the probe is shown schematically in FIG. 1. Note that FIG. 1, and all figures used herein are conceptual schematics, omitting details of the circuit that relate to fine points of a particular implementation. This simplification improves the clarity of the presentation and prevents implementation details from obscuring the broader concepts of each particular approach. In FIG. 1, the sum of an input voltage $V_i$, and an output voltage $V_o$ are equal to the voltage $V_s$ presented to the capacitive divider $(C_{ref}+C_{probe})$. The voltage on the probe capacitor $C_{probe}$ is the input to a unitary buffer 2 having the output voltage $V_o$. An idealized unitary buffer has infinite input impedance and exhibits the same voltage at the input and output.

Circuit analysis applied to FIG. 1 shows that the relationship between the output voltage and the input voltage is expressed by equation 4.

$$v_i + v_o = v_s \tag{4a}$$

$$v_s \left( \frac{C_{ref}}{C_{ref} + C_{probe}} \right) = v_0$$

$$\frac{v_o}{v_i} = \frac{C_{ref}}{C_{probe}}, \tag{4}$$

where $V_o$ and $V_i$ represent the output voltage and input excitation source respectively, and $C_{ref}$ and $C_{probe}$ represent a reference capacitor and the probe capacitor respectively. The combination of the reference capacitor and the excitation source set the current in the probe to a constant value that will yield an output voltage that is within a desired range. Substituting Equation 1 into Equation 4 yields a relationship between $V_o$ and $V_i$ expressed in Equation 5.

$$\frac{v_o}{v_i} = \frac{C_{ref} d}{k \varepsilon_0 A} \tag{5}$$

Equation 5 confirms that for the circuit of FIG. 1, there is a linear relationship between $V_o$ and d.

The circuit of FIG. 1 does not protect the probe capacitance from parasitic effects. To realize the linear relationship between the circuit's transfer function and the distance, the probe must be guarded to prevent parasitic capacitances from appearing in parallel with the probe capacitance. The output voltage, which tracks the probe voltage, (Eq. 4a) is typically used to guard the probe capacitor, as shown in FIG. 2.

Figure 2:
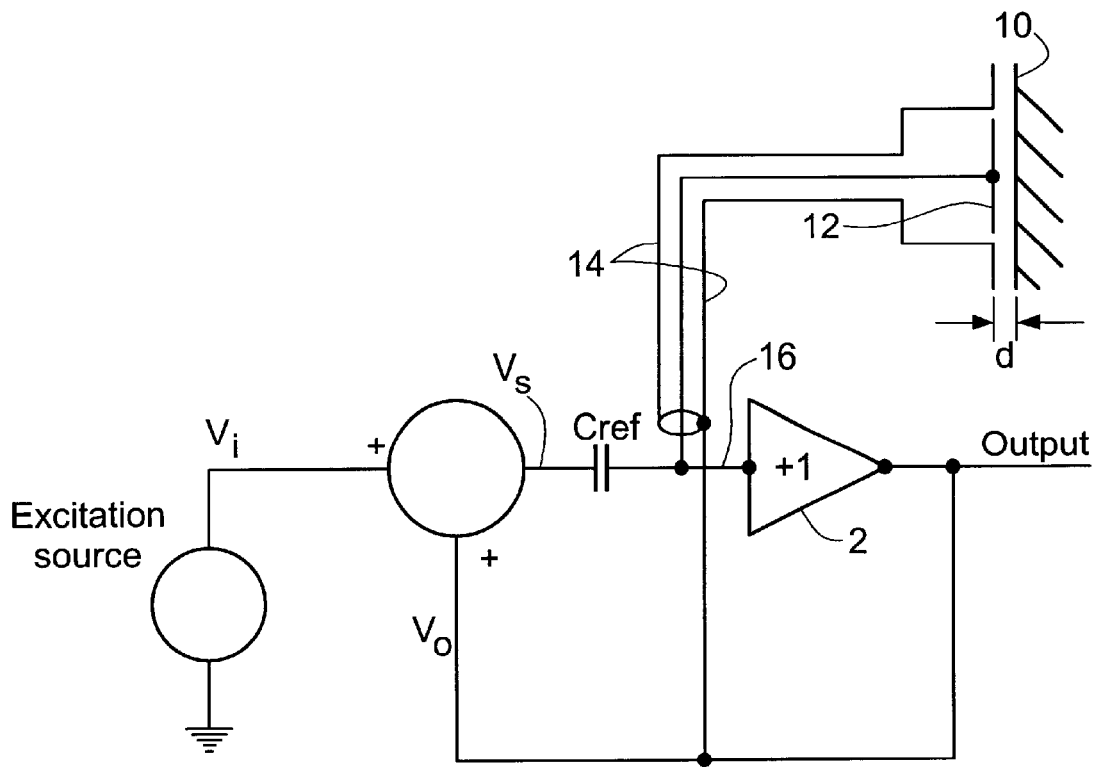
FIG. 2 is a conceptual schematic of the capacitive displacement probe of FIG. 1 with the probe capacitance guarded.

In FIG. 2, further details of $C_p$ probe are shown. The target 10 is typically grounded. The plate 12 of capacitor $C_p$ probe is a distance d away from the target 10. Output voltage $V_o$ is connected the shields 14 protecting plate 12 and the plate's connection to the input of the unity-gain buffer 2.

Although a connection mechanism such as illustrated in FIG. 2 would seem to be fully functional, a problem exists. Typical probe capacitances $C_p$ probe are often tenths of even hundredths of a picofarad. The input impedance of the unity-gain buffer 2, connected to the circuit at point 16, must be high enough to not substantially alter the transfer function of the capacitive divider circuit. For buffer amp 2, the primary means to assure the high input impedance, is to bootstrap the buffer amp's power-supply connections (not shown). When an amplifier's power-supply is boot strapped, the − and − power inputs are slaved to the output voltage of the amplifier. As the output rises, both the + and − rise, maintaining the voltage differential, but moving the center point in concert with the output.

Figure 3:
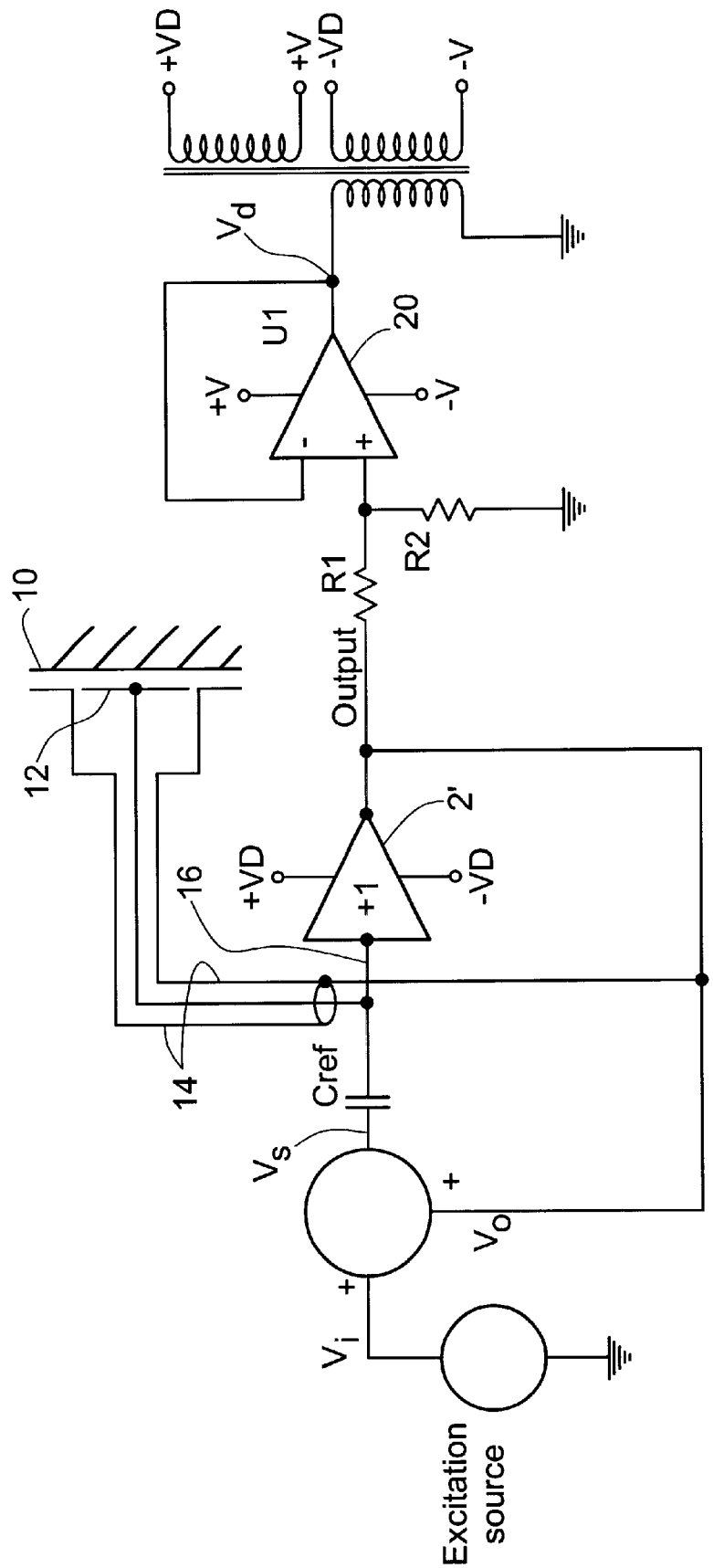
FIG. 3 is a conceptual schematic of a capacitive displacement probe circuit incorporating bootstrapped power inputs to a unitary buffer amp.

An illustrative schematic of a circuit incorporating bootstrapped power inputs to a unitary buffer amp 2' is shown in FIG. 3. The power inputs to unitary buffer amplifier 2' are explicitly shown as $+V_D$ and $-V_D$. In FIG. 3, +V and −V represent the external power connections to a transformer and output $V_o$ connects to a differential amplifier 20 whose output $V_d$ drives the transformer that provides bootstrapped voltages $+V_D$ and $-V_D$. The two driven voltages, $+V_D$ and $-V_D$ are used to power the unity-gain buffer 2'. The ratio of R1 and R2 is typically set so the gain through them is slightly less than one. Although FIG. 3 shows $+V_D$ and $-V_D$ as the only power-supply connections to the unity-gain buffer 2', implementations in which $+V_D$ and $-V_D$, as well as +V and −V connect to the buffer are also possible. A transformer implements the driven supply in the illustrative example of FIG. 3, but other means are known and can be used for this purpose.

The supply-driver circuit must have a flat, wideband frequency response, because the supply inputs to the buffer stage substantially affect the buffer's frequency response. The required flat, wideband frequency response of the power supply adds cost and complexity to the design of FIG. 3.

Figure 4:
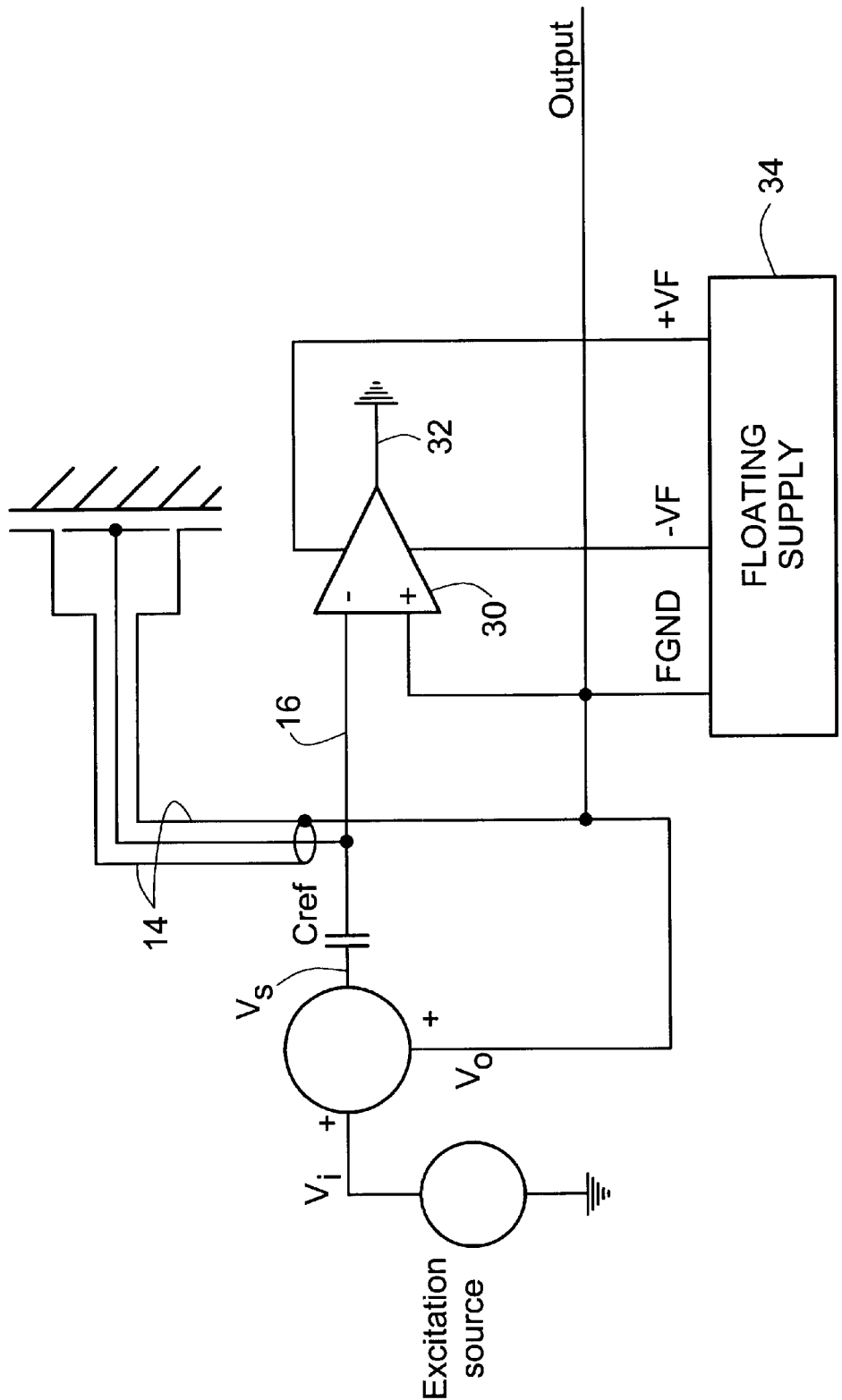
FIG. 4 is a conceptual schematic of a idealized capacitive displacement probe with the output processed by a differential amplifier and a floating supply as is known in the art.

An alternate implementation, shown in FIG. 4, obtains the desired transfer function using a differential amplifier 30, such as an operational amplifier, in place of the unity-gain buffer 2, 2'. This implementation connects the differential amplifier's output 32 to ground. As is known in the art, one alternative when the differential amplifier's output 32 is grounded, is to power the amplifier 30 by a floating power supply 34. A floating power supply 34 is one that is isolated at DC from ground and has sufficient AC isolation to not unduly load the differential amplifier 30. Although the circuit topology of FIG. 4 looks quite different from that of FIG. 3, circuit analysis shows that they exhibit the same transfer function, thereby performing the same function. Because the differential amplifier's power supply connections $+V_F, -V_F$ move with the amplifier's summing junction 16, the topology of FIG. 4 is inherently bootstrapped. The disadvantage of this implementation is the cost, size, and complexity associated with the floating supply.

Figure 5:
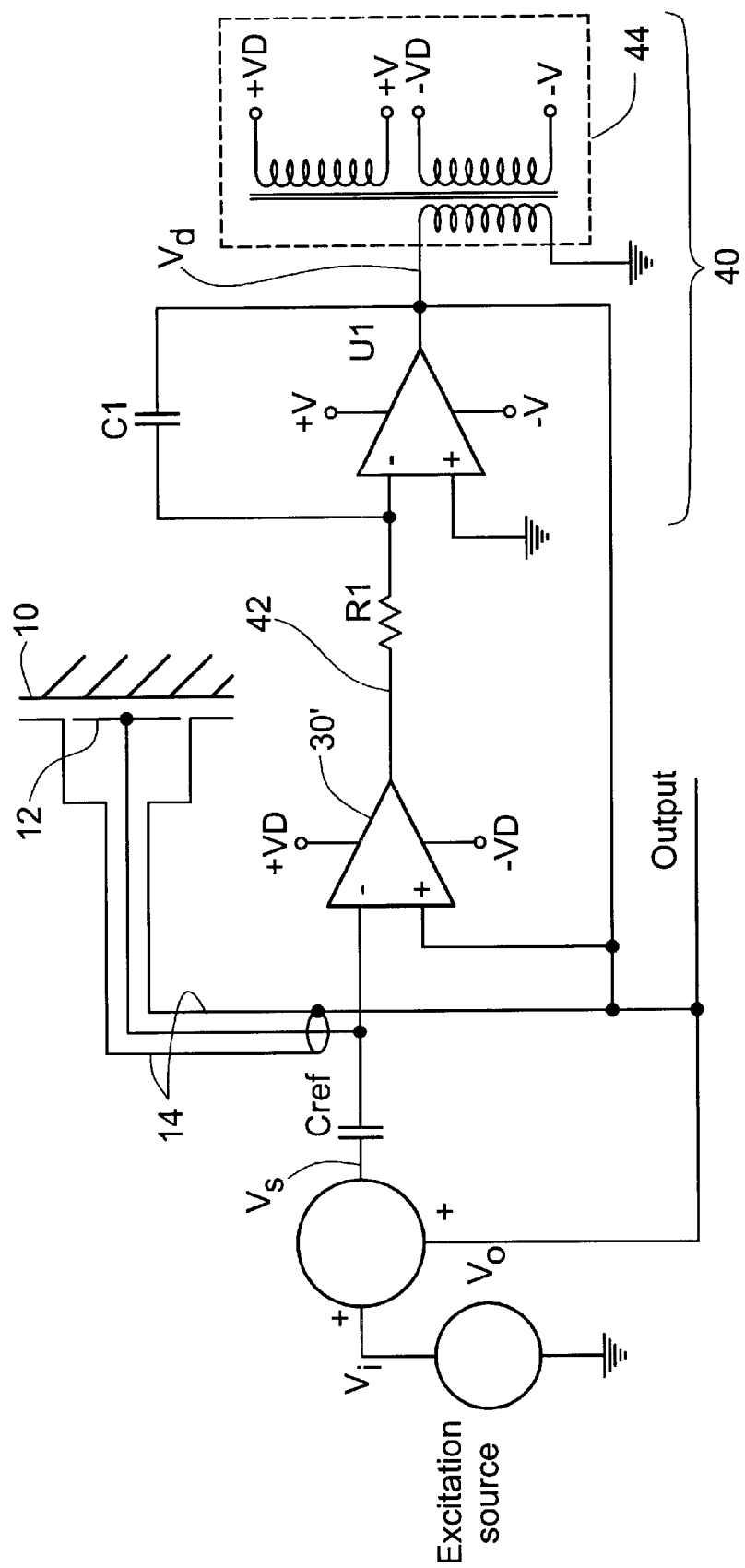
FIG. 5 is a conceptual schematic of a idealized capacitive displacement probe with the output processed by a differential amplifier and a driven supply as is known in the art.

An alternate implementation known in the art, shown in FIG. 5, uses a differential amplifier 30' with a driven supply 40 rather than the floating supply 34 of FIG. 4. The supply-driver circuit 44 keeps the output 42 of the transducer-interface amplifier 30' at ground potential. The component labeled $C_1$ represents a compensation network, which in any particular implementation, may consist of other components as is known in the art. Alternate implementations of the driven supply circuit 44 function are known in the art. The circuits of FIGS. 3 and 5 share the characteristic that the phase and frequency response of the supply driver circuit 44 affects the response of the differential amplifier 30, 30' that may have connections to both the driven and the external power supply. Each of the prior art circuits of FIGS. 3–5 have disadvantages that are associated with the need for the driven or floating supplies as listed above.

Figure 6:
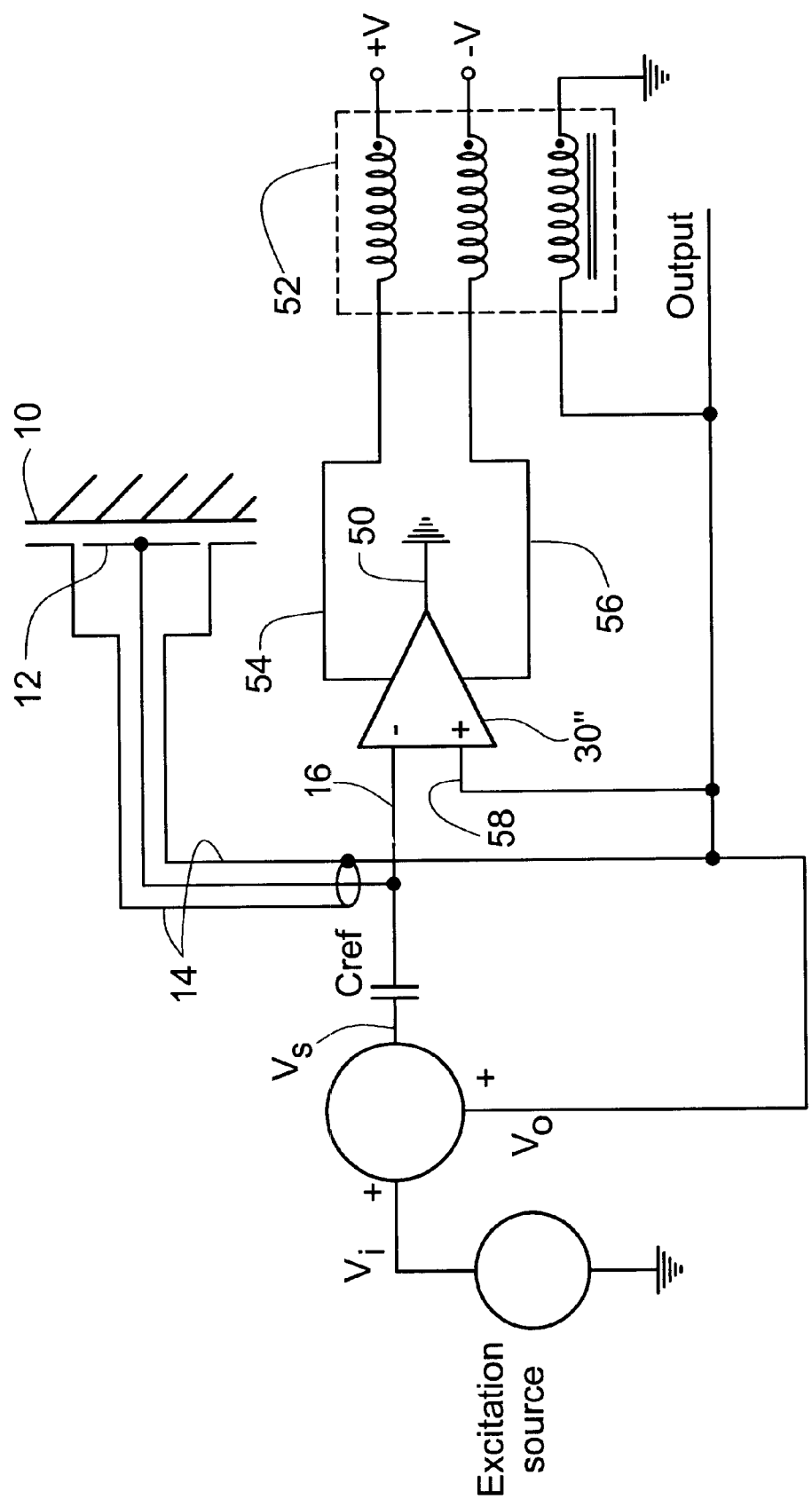
FIG. 6 is a conceptual schematic of a idealized capacitive displacement probe with a self-bootstrapping transducer interface stage.

FIG. 6 illustrates a circuit in which the transducer interface stage generates its own bootstrapping voltages. A differential amplifier 30" with an output 50 grounded is used as a transducer interface stage as described with reference to the circuit of FIG. 4. The power 54, 56 and common 50 connections to the transducer interface stage are made via a 3-winding transformer 52 in which the three windings are equal in turns and are closely coupled. In this circuit, current that flows to ground through the grounded output 50 by necessity flows through one of the windings of the illustrated transformer, causing the common voltage and both supply voltages to be perfectly bootstrapped.

As an illustration, if the input voltage on line 16 tries to fall, the output 50 tries to move up at the same time. This causes current to flow in the +V arm of the transformer 52. The transformer presents a high impedance load to power input 54 causing the voltage at 54 to fall. Since transformer 52 is closely coupled, the voltage drop in the +V/54 line causes drops in the −V/56 line and the GND/58 line.

The transformer windings, being identical, function symmetrically depending on the change in input 16. When the transistor, internal to differential amplifier 30", connected between +V input 54 and the output 30 is turned on, the upper winding of the transformer 52 acts as the primary, and the two lower windings act as secondaries. Analogously, when the transistor, internal to differential amplifier 30", connected between −V input 56 and output 50 is turned on, the lower winding of the transformer 52 acts as the primary, and the two upper windings act as secondaries.

The circuit of FIG. 6 has several advantages over the prior-art methods. Because the circuit utilizes no active components, the limitations in phase and frequency response imposed by active components are not seen, also the cost associated with active circuitry is eliminated. Cost is further reduced by the elimination of the driven or floating power supply. The size of a package containing the circuit is reduced by elimination of active circuitry and the means necessary to create a floating supply. The reduction in the number of parts, active and passive, improves the reliability of the product.

The transformer 52 used in the new circuit is simpler to manufacture than transformer 40 used in the prior art. All windings are identical and there are no concerns about inter-winding capacitance. The transformer 52 can be a tri-filer, simple to manufacture using a common core, providing a very accurate wideband transfer function. The invention requires no separate power supply.

Having described preferred embodiments of the invention it will now become apparent to those of ordinary skill in the art that other embodiments incorporating these concepts may be used. Accordingly, it is submitted that the invention should not be limited by the described embodiments but rather should only be limited by the spirit and scope of the appended claims.

We claim:

1. A mechanism to provide a bootstrapped power source for a differential operational amplifier having a plus and a minus input, a plus and a minus power input and an output, said mechanism comprising:

a three-winding transformer, a first winding of said three windings disposed between a positive voltage and said plus power input yielding an initial plus voltage, a second winding of said three windings disposed between a negative voltage and said minus power input yielding an initial minus voltage, and a third winding of said three windings disposed between a ground and said plus input providing a feedback path;

said differential operational amplifier output connected to said ground; and said differential operational amplifier minus input connected to a signal, wherein when said signal is displaced a first amount from a first voltage, said plus and minus power inputs are displaced said first amount from said initial positive voltage and said initial minus voltage.

2. The mechanism of claim 1 wherein said three-winding transformer has an equal number of turns that are closely coupled.

3. A method of providing a bootstrapped power source for a differential operational amplifier using a three-winding transformer comprising:

connecting an output of said differential operation differential operational amplifier to ground;

connecting a first winding of said transformer between a positive power source and a positive power input of said differential operational amplifier;

connecting a second winding of said transformer between a negative power source and a negative power input of said differential operational amplifier; and connecting a third winding of said transformer between a ground and a positive input of said differential operational amplifier.

4. A capacitive displacement sensor comprising:

an excitation source;

an amplifier configured as a buffer;

a reference capacitor coupled between one end of said excitation source and a negative input of said buffer;

a probe capacitor connected between said negative input of said amplifier and ground;

an output of said amplifier connected to ground;

a first winding of a three-winding transformer connected between a positive voltage and a positive power connection of said amplifier;

a second winding of said three-winding transformer connected between a negative voltage and a negative power connection of said amplifier; and a third winding of said three-winding transformer connected between ground and a positive input of said buffer, said positive input of said buffer further connected to a guard of said probe capacitor.

5. The capacitive-displacement sensor of claim 4 wherein said three-winding transformer has an equal number of turns that are closely coupled.

6. A unitary-gain amplifier providing an output that mirrors an input comprising:

a differential amplifier biased for unitary gain;

an output of said differential amplifier connected to ground;

said input connected to a negative input of said differential operational amplifier;

a first winding of a three-winding transformer connected between a positive power source and a positive power input of said differential operational amplifier;

a second winding of said three-winding transformer connected between a negative power source and a negative power input of said differential operational amplifier; and a third winding of said three-winding transformer connected between a ground and a positive input of said differential operational amplifier, wherein said positive input is an output of said amplifier.

7. A mechanism to provide a bootstrapped power source for a differential operational amplifier having a plus and a minus input, a plus and a minus power input and an output, said mechanism comprising:

a three-winding transformer, a first winding of said three windings disposed between a positive voltage and said plus power input yielding an initial plus voltage, a second winding of said three windings disposed between a negative voltage and said minus power input yielding an initial minus voltage, and a third winding of said three windings disposed between a stable reference and said plus input providing a feedback path;

said differential operational amplifier output connected to said stable reference; and said differential operational amplifier minus input connected to a signal, wherein when said signal is displaced a first amount from a first voltage, said plus and minus power inputs are displaced said first amount from said initial positive voltage and said initial minus voltage.

* * * * *

UNITED STATES PATENT AND TRADEMARK OFFICE
CERTIFICATE OF CORRECTION

PATENT NO.    : 6,476,621 B1
DATED         : November 5, 2002
INVENTOR(S)   : Roy E. Mallory It is certified that error appears in the above-identified patent and that said Letters Patent is hereby corrected as shown below:

<u>Title page,</u>
Item [73], Assignee, "Westwoods," should read -- Westwood, --;
Item [57], ABSTRACT,
Line 10, delete "said";

<u>Column 1,</u>
Line 29, "$\epsilon$hd" should read -- $\epsilon_0$ --; and

<u>Column 4,</u>
Line 11, "the - and - power" should read -- the + and - power --.

Signed and Sealed this

Twelfth Day of August, 2003

JAMES E. ROGAN
*Director of the United States Patent and Trademark Office*